United States Patent [19]

Lindsay

[11] Patent Number: 5,574,249
[45] Date of Patent: Nov. 12, 1996

[54] HIGH RESISTIVITY INNER SHIELDS FOR CABINETS HOUSING ELECTRONIC CIRCUITRY

[75] Inventor: David S. Lindsay, Sunnyvale, Calif.

[73] Assignee: Lindsay Audiophile Inc., Sunnyvale, Calif.

[21] Appl. No.: 276,741

[22] Filed: Jul. 18, 1994

[51] Int. Cl.⁶ .................................................. E04F 15/00
[52] U.S. Cl. ........................ 174/35 R; 361/816; 361/818
[58] Field of Search .............................. 174/35 R, 356 C, 174/35 MS; 361/816, 818; 428/28

[56] References Cited

U.S. PATENT DOCUMENTS

| | | | |
|---|---|---|---|
| 2,622,152 | 12/1952 | Rosch | 333/243 |
| 3,591,704 | 7/1971 | Ebel | 174/8 |
| 3,878,319 | 4/1975 | Wahl | 174/106 SC |
| 4,109,098 | 8/1978 | Olsson et al. | 174/106 SC |
| 4,218,578 | 8/1980 | Olschewski et al. | 174/35 R |
| 4,487,996 | 12/1984 | Rabinowitz et al. | 174/105 R |
| 4,626,618 | 12/1986 | Takaoka et al. | 174/105 SC |
| 4,686,127 | 8/1987 | Burns et al. | 174/35 MS X |
| 4,757,297 | 7/1988 | Frawley | 174/36 X |
| 4,785,138 | 11/1988 | Breitenbach et al. | 174/106 SC |
| 4,831,210 | 5/1989 | Larson et al. | 174/35 MS |
| 4,848,566 | 7/1989 | Havens et al. | 206/328 |
| 4,896,001 | 1/1990 | Pitts et al. | 174/35 MS |
| 5,006,670 | 4/1991 | Plant | 174/106 SC |
| 5,098,735 | 3/1992 | Henry | 174/35 MS X |
| 5,274,712 | 12/1993 | Lindsay et al. | 174/36 X |
| 5,286,318 | 2/1994 | Sims et al. | 174/35 MS X |

*Primary Examiner*—Laura Thomas
*Attorney, Agent, or Firm*—Skjerven, Morrill, MacPherson, Franklin & Friel, LLP; Brian D. Ogonowsky

[57] ABSTRACT

In one embodiment of a cabinet for housing electronic circuitry, a high resistivity inner shield surrounds and is insulated from the enclosed electronic circuitry within the cabinet. The inner shield is surrounded by, and optionally insulated from, an outer, highly conductive shield. This approach may be thought of as shielding the enclosed electronic circuitry from the outside highly conductive metal shield. The inner shield attenuates the effects of fluctuating voltage gradients in the outer shield on the enclosed electronic circuitry.

13 Claims, 1 Drawing Sheet

HIGH RESISTIVITY INNER SHIELDS FOR CABINETS HOUSING ELECTRONIC CIRCUITRY

FIELD OF THE INVENTION

This invention relates to cabinets for housing electronic circuitry, in particular, to an improved shield for such cabinets to improve the sound quality of audio signals carried in such electronic circuitry enclosed by such cabinets.

BACKGROUND OF THE INVENTION

In audio systems, electrical cables are used to carry signals from one component to another, such as from a CD player to an audio preamplifier, or from a preamplifier to a power amplifier. Such cables are usually shielded in order to prevent a central conductor, conducting the audio signal, within the cable from picking up outside electrical signals, such as hum from power wiring and other interference. Shielding almost always consists of placing the central conductor within a grounded, highly conductive metal tube such as formed by woven copper strands, aluminized mylar tape, or the like. Sometimes a separate ground lead is placed within the shield and insulated from both the shield and the central conductor, or, alternatively, the shield itself may be used as the ground lead.

Similarly, the circuitry within audio equipment (e.g., CD players, preamplifiers, amplifiers, tape players, etc.) is sometimes shielded by means of a grounded metal box to block outside electrical signals from interfering with the low level audio signals being generated within the audio equipment.

All these above-mentioned shielding methods are based on the same principle that the wire or system to be shielded is placed within an highly conductive enclosure, usually made of metal. Such a shield is sometimes called a Faraday cage. Faraday cages are employed because Maxwell's equations (which govern electromagnetic phenomena) teach that there can be no electrostatic field penetration from the outside to the inside of a perfectly conducting, closed surface.

Although the above methods of shielding are effective in preventing externally generated electric fields from penetrating into the central conductor of a cable or into the enclosed audio circuitry, the above methods of shielding degrade the quality of the audio signals conducted in the audio cables or generated by the audio circuitry. Such degradations are audible to a well-trained ear, as confirmed by listening tests that have been conducted; however, these degradations are subtle and are typically not detectable by standard oscilloscope traces, nor are they apparent on the usual distortion measuring equipment.

In the case of shielded cables, I believe that the cause of such degradation stems from the fact that the highly conductive shield intersects magnetic field lines generated by the current carried by the central conducting wire. These intersected field lines, in turn, induce eddy currents in the shield, which cause fluctuating voltage gradients (or electric fields) along the shield. These fluctuating voltage gradients are capacitively coupled to the central conductor and thus degrade the audio signal carried on the central conductor.

Similarly, the frequently used, highly conductive shielding cabinet surrounding an audio circuit may affect the sound quality of the audio circuit. The magnetic fields generated by currents flowing through the output leads of amplifier circuits within the cabinet may induce small eddy currents in the conducting walls of the cabinet. Such eddy currents produce fluctuating electric fields which, in turn, induce small currents in the input leads of amplifiers within the cabinet. The small induced currents in the input leads will be greatly amplified and thus may produce noticeable effects at the outputs of the amplifiers.

Thus, what is needed is an audio cable and improved type of shielding for audio circuits which do not suffer from the above-identified drawbacks with typical shielded cables and audio equipment cabinets.

SUMMARY OF THE INVENTION

The above-described drawbacks of conventional shielded cables and cabinets are overcome to a great extent by employing one or more high resistivity shields within the shielded cable or cabinet which is much less conductive than the standard metallic shield. More specifically, in one embodiment of a cabinet for enclosing electronics, a high resistivity shield would form an inside surface of the cabinet, while a highly conductive metal outside surface of the cabinet would surround the high resistivity shield.

This approach may be thought of as shielding the enclosed electronic circuitry from the outside highly conductive metal shield so as to attenuate the effects of fluctuating voltage gradients in the outside metal shield. Two or more sets of high resistivity inner shields, each insulated from one another, may be used in conjunction to further reduce the effects of fluctuating voltage gradients in the outside highly conductive shield.

In another embodiment, the highly conductive metal outer surface of the cabinet is eliminated, and the high resistivity shield by itself is used to shield the internal circuitry from outside electrical interference. The high resistivity of the shield prevents significant eddy currents from forming in the high resistivity shield.

If the high resistivity shields in the cable or in the cabinet are insulated from the outside metal shield and insulated from any central conductor or electronic circuitry, these high resistivity shields are grounded preferably at a single point.

DETAILED DESCRIPTION OF THE PREFERRED EMBODIMENT

Figure 1:
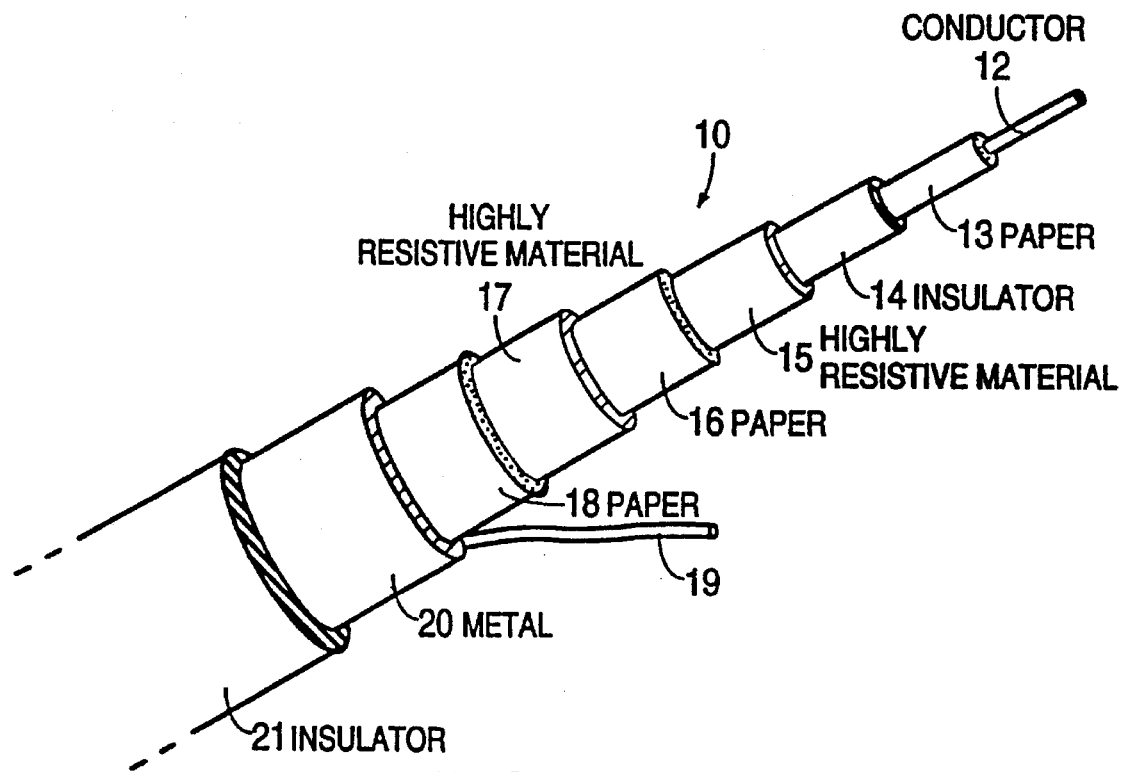
FIG. 1 illustrates one embodiment of an electrical cable for audio signals in accordance with the invention.

FIG. 1 shows an audio cable 10 incorporating an inner shield to reduce distortion of an audio signal carried by cable 10. The audio cable 10 has been stripped away at various intervals to illustrate the construction of the audio cable 10. A central conductor 12 is used to carry the audio signal.

Conductor 12 may be formed of a highly conductive material such as copper. Such a central conductor 12 would be conventional.

In the preferred embodiment, however, conductor 12 is formed of a high magnetic permeability material to reduce distortion as described in U.S. Pat. No. 4,964,738, entitled "Electrical Conductor of High Magnetic Permeability Material for Audio Circuits."

Surrounding conductor 12 is a spacing layer of paper 13, and surrounding paper 13 is an insulator 14. Insulator 14 may be any type of resilient dielectric used in conventional audio cables. In the preferred embodiment, insulator 14 is a layer of Mylar film.

Surrounding insulator 14 is a high resistivity inner shield 15, which is of a much higher resistivity than that of a typical metallic shield used in audio cables. Inner shield 15 may be formed of any of various types of highly resistive materials. Some materials which have been successfully employed thus far include: conducting plastic tape, paper tape with carbon deposited on one side, plastic tape with carbon deposited on one side, or paper tape treated with conductive ink. Commercially available conducting plastic tape may have a surface resistivity in the range of 100 to 1000 ohms. Commercially available types of paper tape with carbon film or conductive ink deposited on one side may have a surface resistivity in the range of 100,000 ohms to one megohm. Commercially available plastic tape with carbon film deposited on one side may have a surface resistivity in the range of one megohm to ten megohms. In contrast, the surface resistivity of a braided copper shield that forms conventional shielding wire in a coaxial audio cable may be approximately $10^{-4}$ ohms. Thus, commercially available, non-metallic conducting films which may be effectively utilized in the audio cable 10 of FIG. 1 have surface resistivities which may be higher than conventional metallic shields by factors of approximately $10^6$ to $10^{11}$, although inner shields having a surface resistivity even exceeding one ohm provide an improvement over prior art cables.

In the preferred embodiment, inner shield 15 is carbon treated paper with a surface resistivity of approximately 0.5 megohm.

In an alternative embodiment, paper 13 and insulator 14 are eliminated, and inner shield 15 is formed in contact with conductor 12.

Referring back to FIG. 1, a spacing layer of paper 16 then surrounds inner shield 15.

A second high resistivity inner shield 17, comprising, for example, a carbon treated polymer (i.e., plastic) tape having a surface resistivity of approximately 500 ohms, surrounds paper 16. This inner shield 17 is optional and may be formed of any type of suitable high resistivity material.

Another spacing layer of paper 18 then surrounds inner shield 17.

A copper ground wire 19, insulated with enamel, runs along the length of the cable 10 as an optional high conductivity path for a ground voltage.

To provide effective shielding from high levels of externally generated electrical interference, a highly conductive metallic shield 20, such as aluminized Mylar, is employed to surround ground wire 19 and paper spacer 18.

In an alternative embodiment, paper 18 is eliminated so that inner shield 17 is in contact with metallic shield 20 along substantially the entire length of the cable 10.

Referring back to FIG. 1, an extruded outer insulator 21 surrounds metallic shield 20.

The components forming audio cable 10 are selected so as to be relatively flexible for their use in interconnecting audio equipment. An appropriate connector may be connected at the end of audio cable 10 for coupling inner shields 15 and 17, metallic shield 20, and ground wire 19 to a ground or reference terminal and for coupling conductor 12 to an audio signal lead.

In any multiple inner shield embodiment, it is preferred that the highest resistivity inner shield be placed closest to the central conductor 12. Thus, the inner shields will be successively arranged from the highest resistivity layers to the lowest resistivity layers which culminate in an outermost high conductivity layer of conventional metallic construction.

In another embodiment, only a single high resistivity inner shield is employed. This single inner shield may be either insulated from both the central conductor 12 and outer metal shield 20 or just insulated from either the central conductor 12 or the outer metal shield 20.

Figure 2:
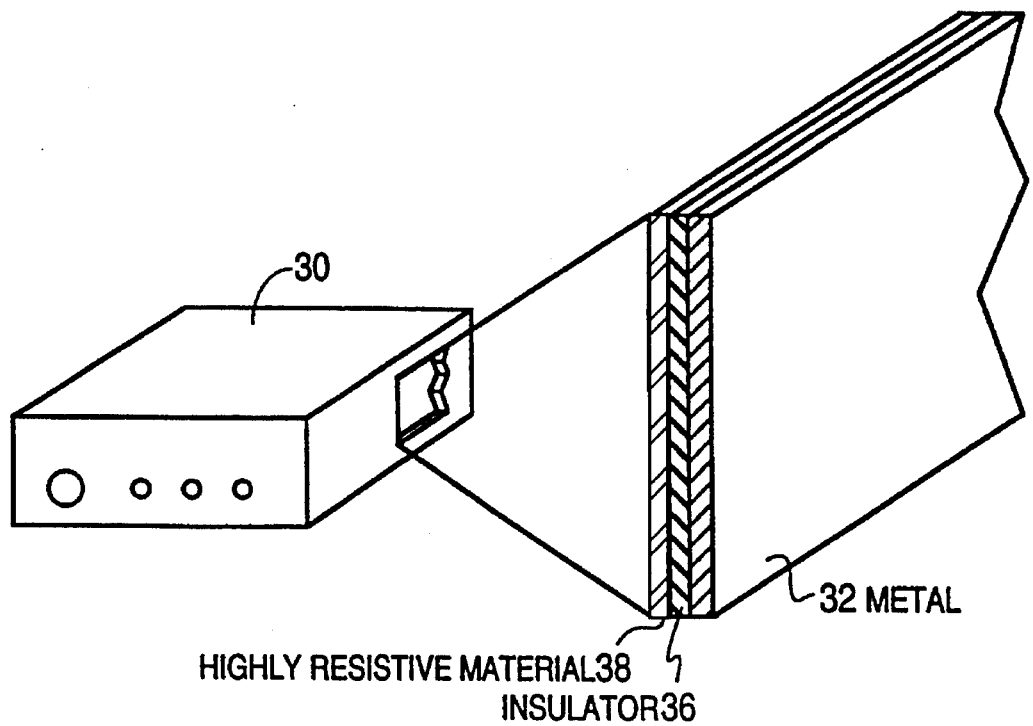
FIG. 2 illustrates a cabinet for housing audio equipment, wherein the cabinet incorporates a high resistivity shield in accordance with one embodiment of the invention.

FIG. 2 illustrates the construction of a shielding cabinet 30 for an audio amplifier. The cabinet 30 may be employed for shielding any type of equipment. Shown in FIG. 2 is a portion of the cabinet 30 cut away and enlarged.

FIG. 2 shows an outer highly conductive metal shield 32 providing a high degree of shielding against outside electrical interference. A layer of insulation 36 is used to insulate a highly resistive inner shield 38 from the outer metal shield 32. In one embodiment, insulation 36 is a plastic sheet, while the highly resistive inner shield 38 is a carbon layer formed on the insulation 36. The inner shield 38 may be formed of the same materials described with respect to inner shield 15 in FIG. 1 or may be formed of any suitable type of material.

Both metal shield 32 and inner shield 38 are grounded at preferably a single point.

In an alternative embodiment, the insulation 36 is eliminated, and the inner shield 38 contacts the metal shield 32.

As described with respect to FIG. 1, multiple inner shields may be used in the construction of cabinet 30, where each inner shield may be insulated from one another and may have a different resistivity.

In the preferred embodiment of the shielded cabinet, ten layers of shielding and insulation are used in addition to a final outer metal cabinet. From the inner most layer out, the first layer has a very high surface resistivity, in the range of one to ten megohms, and is formed by depositing carbon onto paper either by spraying or by saturating the paper with conducting paint. The second layer consists of a thin insulating layer such as paper or thin plastic film. The third layer is made of a commercially available material from Von Roll Isola, Inc. of North Clarendon, Vt., described as "conductive polyester fleece laminate" with a surface resistivity claimed by the manufacturer to be about 10,000 ohms. The fourth layer is formed by another insulating layer of paper or plastic film. The fifth layer consists of a commercially available material from Von Roll Isola described as "conductive polyester fleece" with a surface resistivity claimed by the manufacturer to be in the range of 400 to 1,000 ohms. The sixth layer is another insulating layer of paper or plastic film. The seventh layer is made of a commercially available material from Von Roll Isola described as "conductive non-woven polyester tape" with a surface resistivity claimed by the manufacturer to be in the range of 200 to 400 ohms. The eighth layer is another insulating layer of paper or plastic film. The ninth layer is made from a metal foil, similar to aluminum foil, with only negligible surface resistivity. The tenth layer is another insulating layer of paper or plastic film. The final layer consists of a metal cabinet, such as would typically be used to house electronic circuitry. In the preferred embodiment, the various conductive layers are electrically connected to each other and to the grounded metal cabinet at only one point near the signal's input connector to the circuitry. This is best accomplished by means of a metal pin or rivet, which is driven through the various layers in such a manner as to contact all the conducting layers.

In another embodiment, metal shield 32 and insulation 36 in FIG. 2 are deleted. The high resistivity shield 38, or a plurality of shields 38, is/are chosen to provide the desired shielding against externally generated interference signals. With a cabinet 30 formed of only one or more high resistivity shields, the problems with prior art metal cabinets are avoided while still obtaining effective shielding against interference signals.

In any of the cabinet embodiments described above, the problem with eddy currents in a metal cabinet inducing signals on signal leads of the internal circuitry is avoided.

Thus, an improved cable for electrical signals and an improved cabinet for housing amplifying equipment have been described herein. The teachings of the high resistivity inner shield may be applied to cables and cabinets used for other than audio equipment; the cables and cabinets described herein may be used in conjunction with any equipment where distortionless signals are desired to be transmitted.

While particular embodiments of the present invention have been shown and described, it will be obvious to those skilled in the art that changes and modifications may be made without departing from this invention and its broader aspects and, therefore, the appended claims are to encompass within their scope all such changes and modifications as fall within the true spirit and scope of the invention.

I claim:

1. An enclosure for an electrical circuit, said enclosure comprising:

a plurality of high resistivity shields arranged in a plurality of respective layers, each of said layers substantially surrounding an electrical circuit, wherein the inner-most layer of said plurality of high resistivity shields has a resistivity exceeding approximately 100 ohms and each of the other layers of said plurality of high resistivity shields has a resistivity less than that of its respective adjacent inner layer.

2. The enclosure of claim 1 wherein said electrical circuit includes an amplifier.

3. The enclosure of claim 2 wherein said amplifier is an audio amplifier.

4. The enclosure of claim 1 wherein each of said plurality of high resistivity shields has a resistivity exceeding approximately 100 ohms.

5. The enclosure of claim 1 further comprising a highly conductive outer layer surrounding said plurality of high resistivity shields, said outer layer having a resistivity of less than one ohm.

6. The enclosure of claim 5 wherein said plurality of high resistivity shields and said outer layer are connected together.

7. The enclosure of claim 6 wherein said plurality of high resistivity shields and said outer layer are electrically connected at only one point.

8. The enclosure of claim 5 further comprising an inner conducting layer formed of a highly conductive material surrounding said plurality of high resistivity shields, wherein said outer layer surrounds said inner conducting layer.

9. The enclosure of claim 8 wherein said outer layer, said inner conducting layer, and said plurality of high resistivity shields are electrically connected.

10. The enclosure of claim 8 wherein said outer layer, said inner conducting layer, and said plurality of high resistivity shields are electrically connected at only one point.

11. The enclosure of claim 1 further comprising a plurality of insulating layers, each of which being interposed between respective ones of said plurality of high resistivity shields.

12. The enclosure of claim 1 wherein said plurality of high resistivity shields comprises more than two high resistivity shields.

13. The enclosure of claim 1 wherein said plurality of high resistivity shields are electrically connected together.

* * * * *